(12) United States Patent
Lim et al.

(10) Patent No.: US 6,225,674 B1
(45) Date of Patent: May 1, 2001

(54) SEMICONDUCTOR STRUCTURE AND METHOD OF MANUFACTURE

(75) Inventors: Ik-Sung Lim, Gilbert; David G. Morgan, Phoenix; Kuntal Joardar, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/285,532

(22) Filed: Apr. 2, 1999

(51) Int. Cl.[7] .......................... H01L 29/00; H01L 29/76; H01L 29/94
(52) U.S. Cl. .......................... 257/506; 257/378; 257/328; 257/370; 257/544
(58) Field of Search .................... 257/506, 378, 257/328, 370, 329, 544; 438/419, 358, 921

(56) References Cited

U.S. PATENT DOCUMENTS

| | | | |
|---|---|---|---|
| 4,168,997 | * 9/1979 | Compton | 438/419 |
| 4,246,594 | 1/1981 | Mori | 357/48 |
| 4,670,669 | 6/1987 | Cottrell et al. | 307/297 |
| 4,698,655 | 10/1987 | Schultz | 357/23.4 |
| 4,903,169 | 2/1990 | Kitagawa et al. | 361/424 |
| 4,959,704 | 9/1990 | Isomura et al. | 357/41 |
| 5,116,777 | 5/1992 | Chan et al. | 437/56 |
| 5,146,298 | * 9/1992 | Elkund | 257/378 |
| 5,151,769 | 9/1992 | Immorlica, Jr. et al. | 357/53 |
| 5,405,790 | 4/1995 | Rahim et al. | 437/34 |
| 5,442,228 | 8/1995 | Pham et al. | 257/659 |
| 5,536,665 | 7/1996 | Komori et al. | 437/26 |
| 5,583,363 | * 12/1996 | Momose et al. | 257/378 |
| 5,618,688 | 4/1997 | Reuss et al. | 438/189 |
| 5,650,354 | 7/1997 | Himi et al. | 437/63 |
| 5,789,769 | 8/1998 | Yamazaki | 257/263 |
| 5,807,780 | 9/1998 | Davis et al. | 438/311 |

* cited by examiner

Primary Examiner—Matthew Smith
Assistant Examiner—Igwe U. Anya
(74) Attorney, Agent, or Firm—Robert F. Hightower

(57) ABSTRACT

A semiconductor structure (10) having device isolation structures (43, 44) and shielding structures (39, 40). The shielding structures (39, 40) are formed in a semiconductor material (11) and the device isolation structures (43, 44) are formed within the corresponding shielding structures (39, 40). A noise generating device is formed within a first shielding structure (43) and a noise sensitive device is formed within a second shielding structure (44). The two shielding structures (39, 40) are grounded and prevent noise from the noise generating device from interfering with the noise sensitive device.

4 Claims, 12 Drawing Sheets

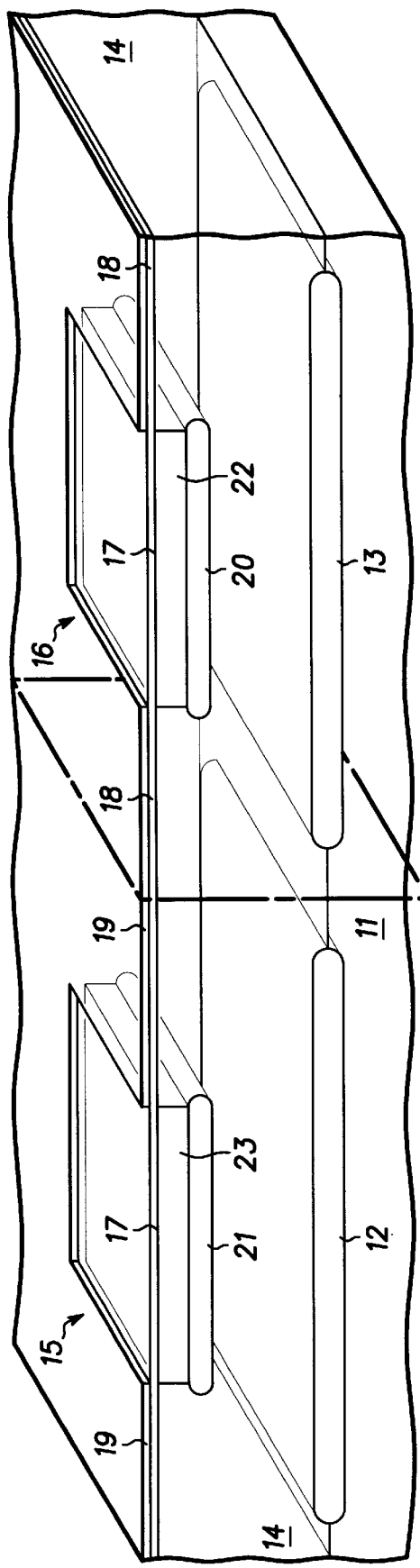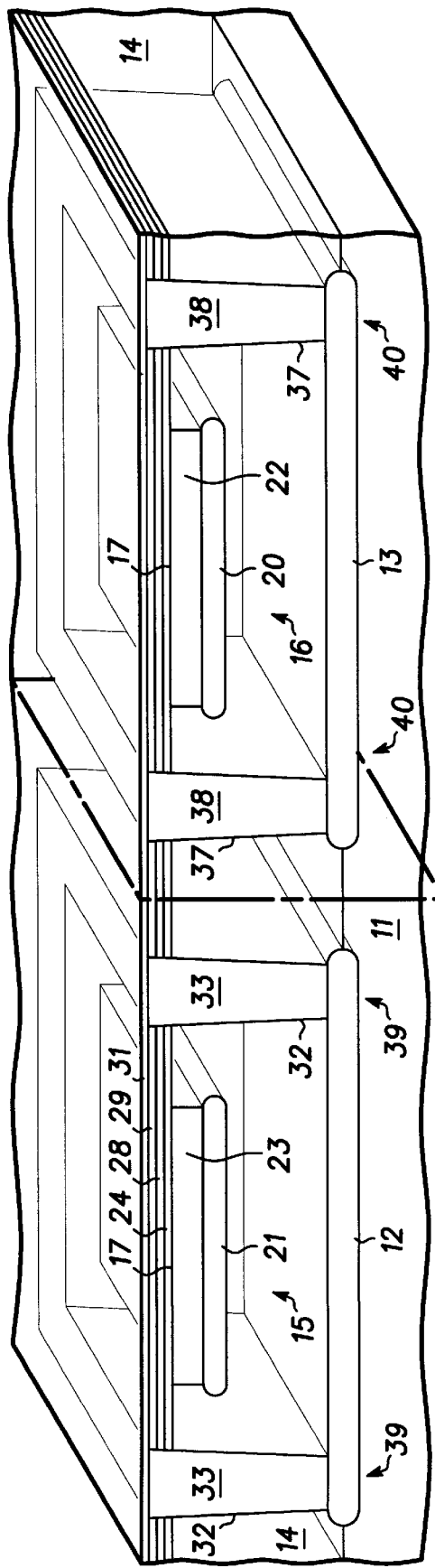

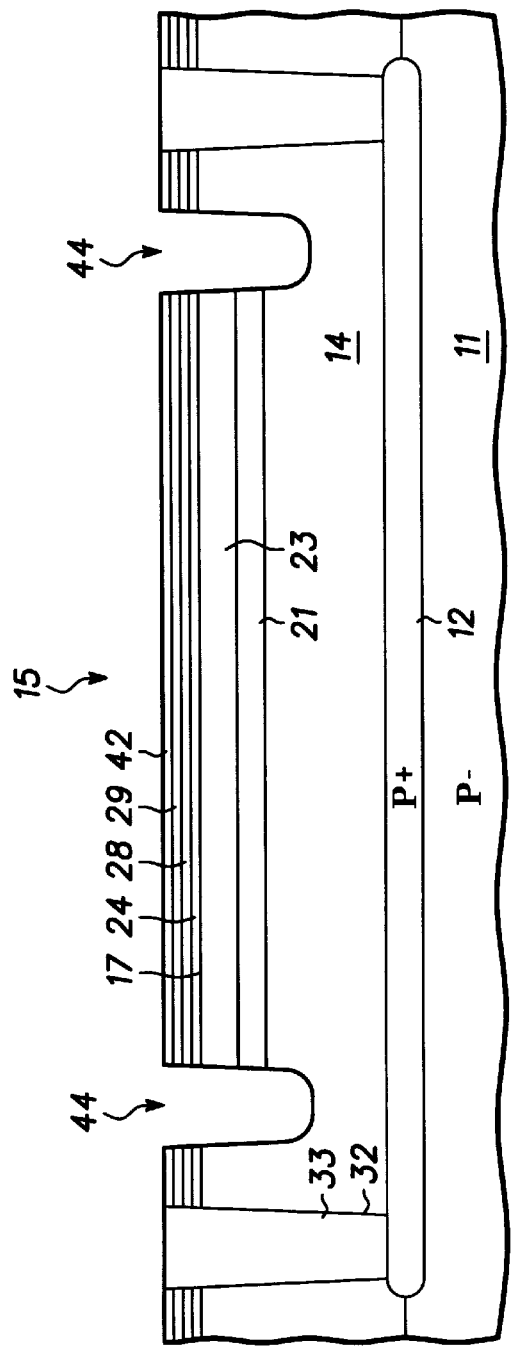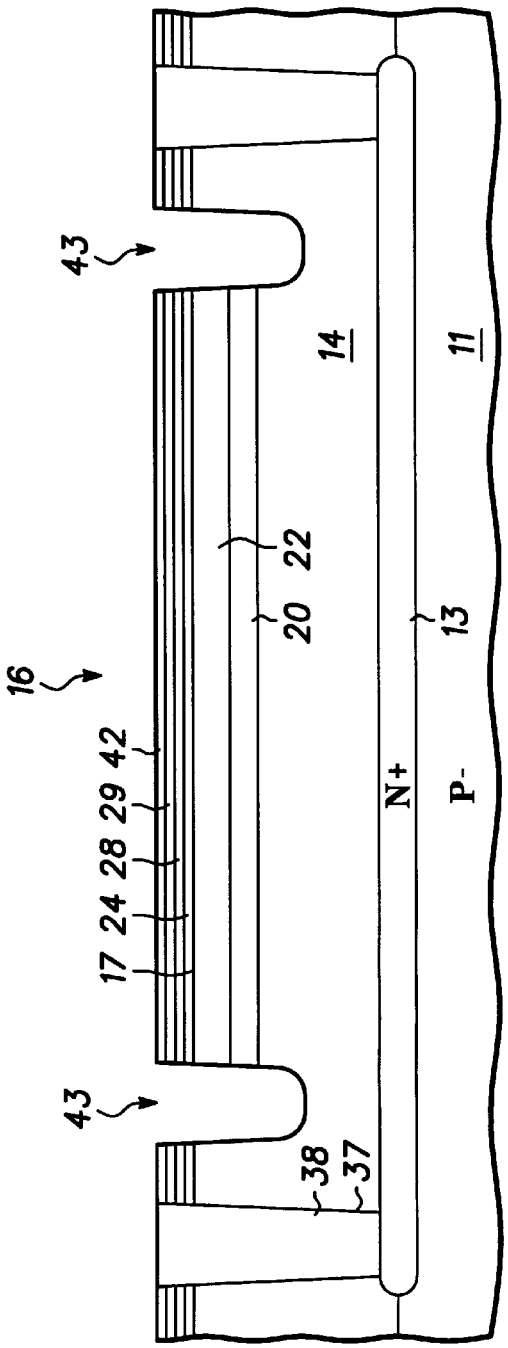

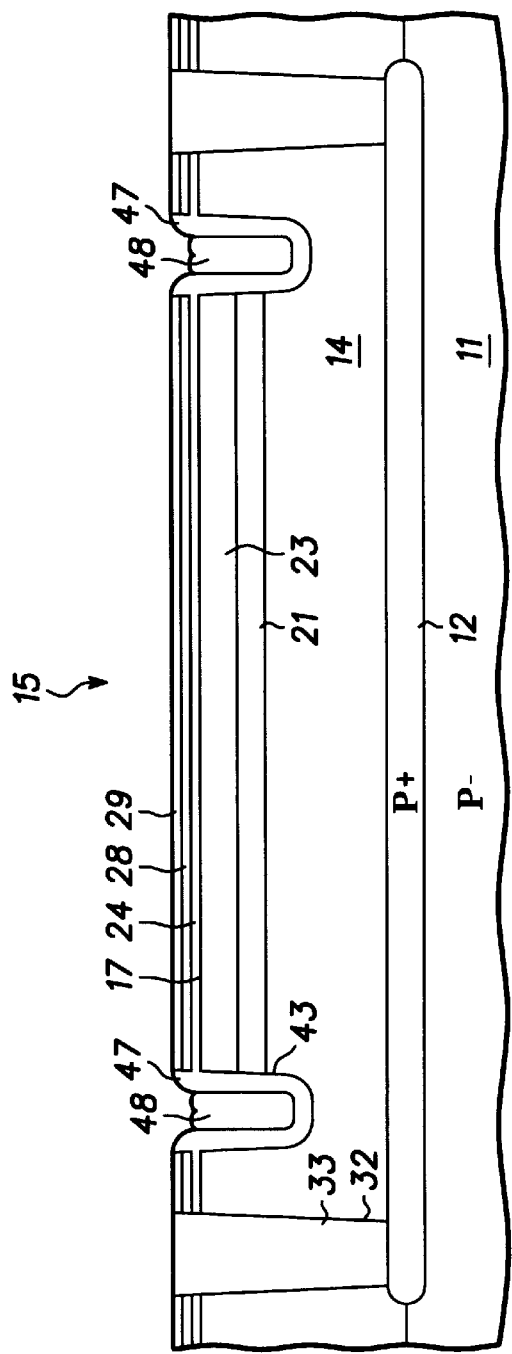
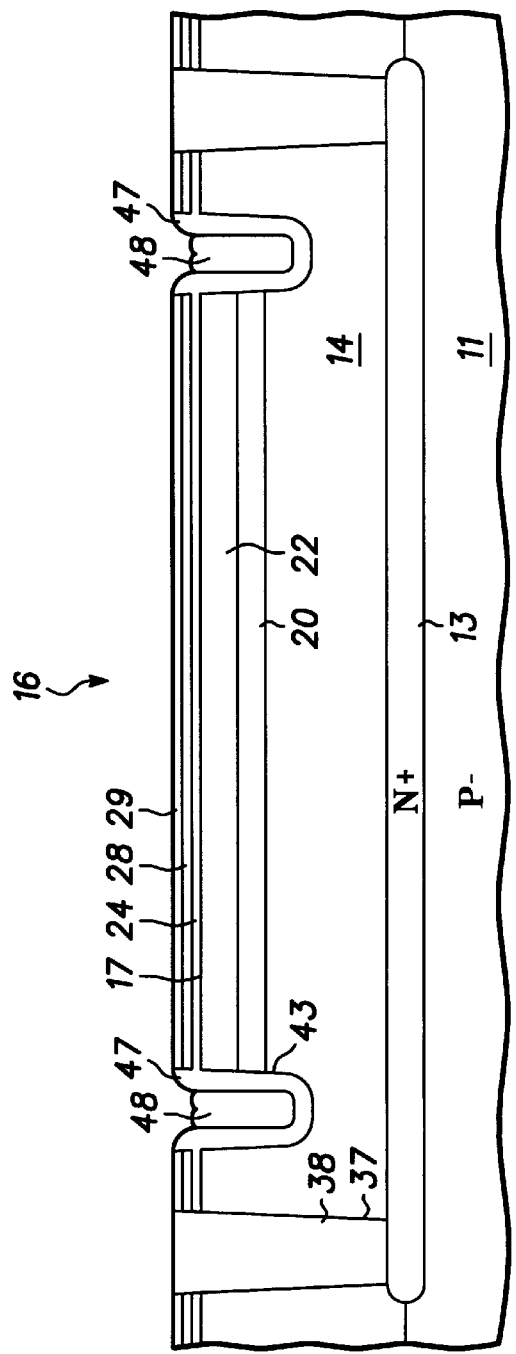

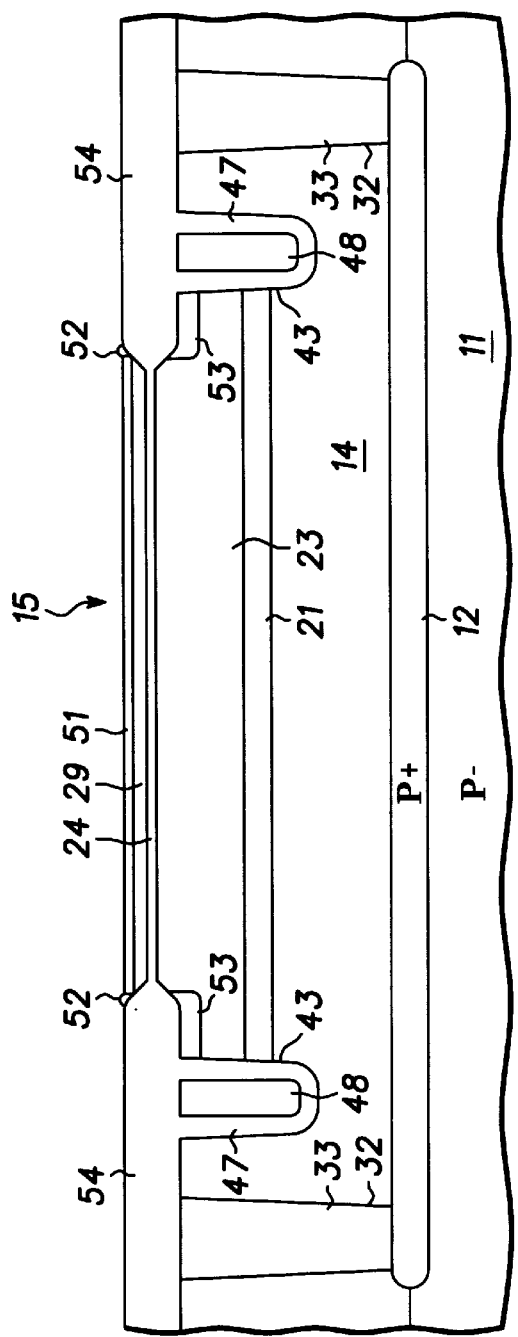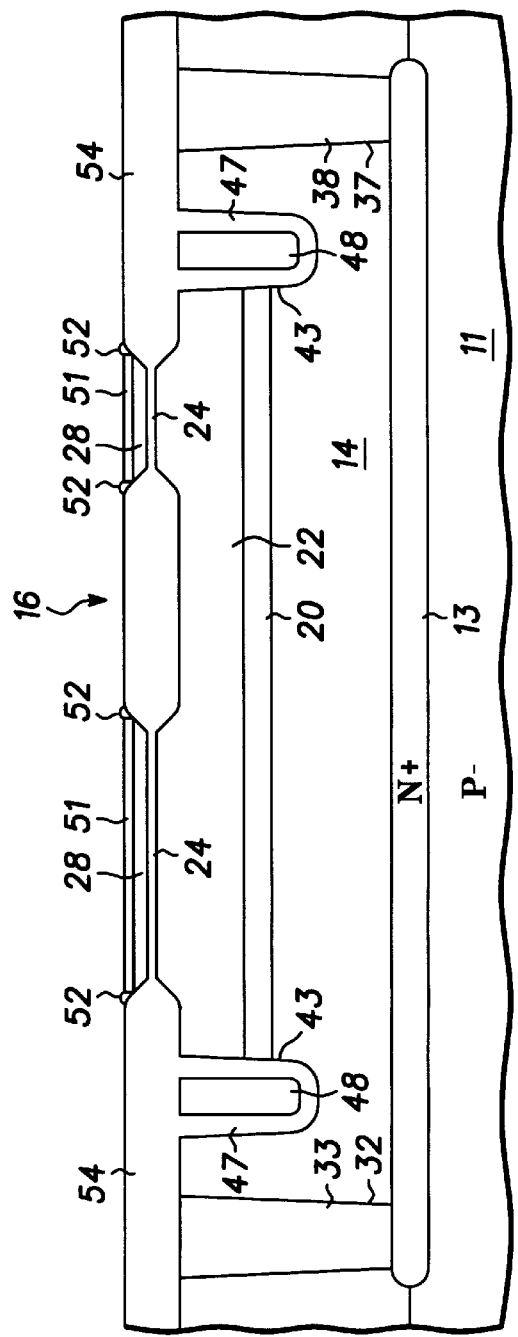

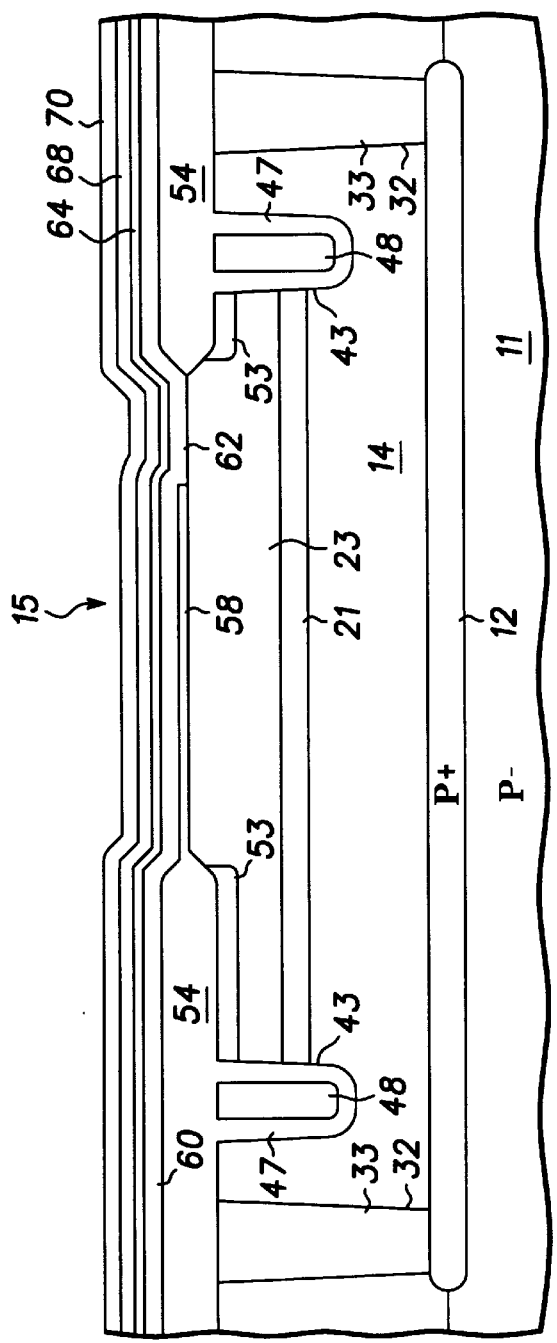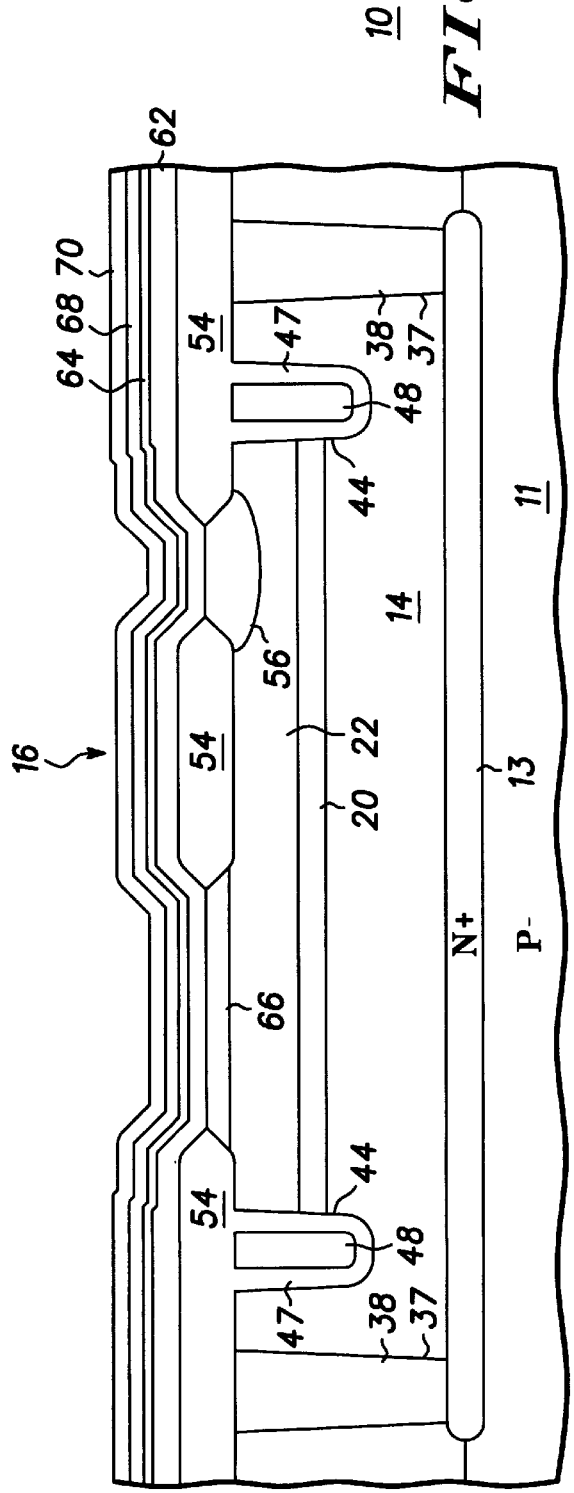

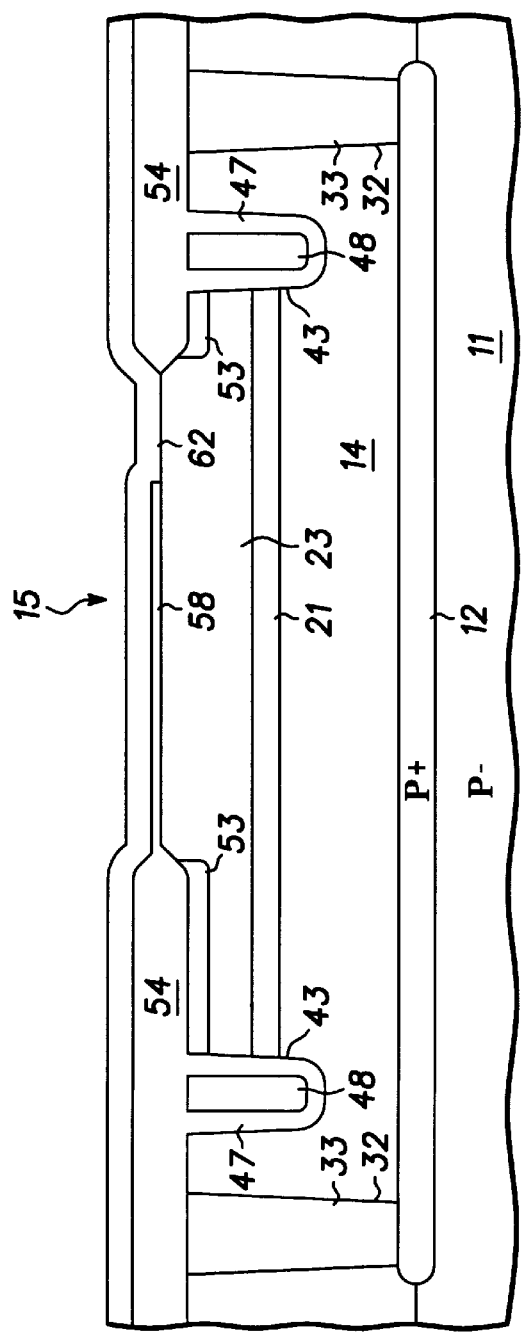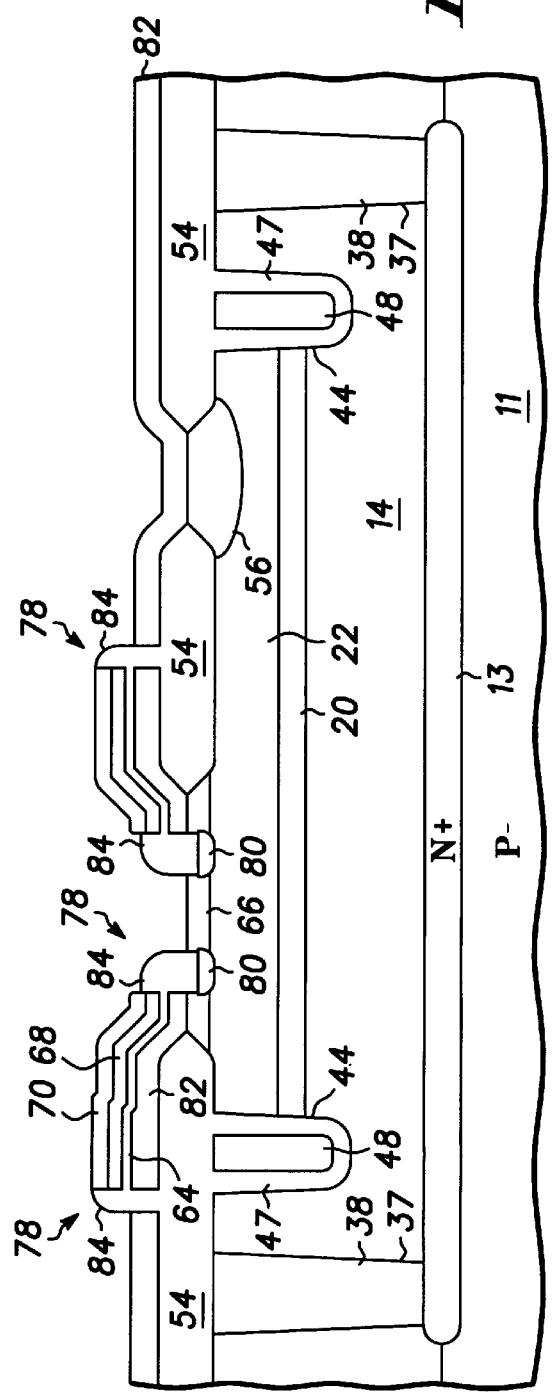

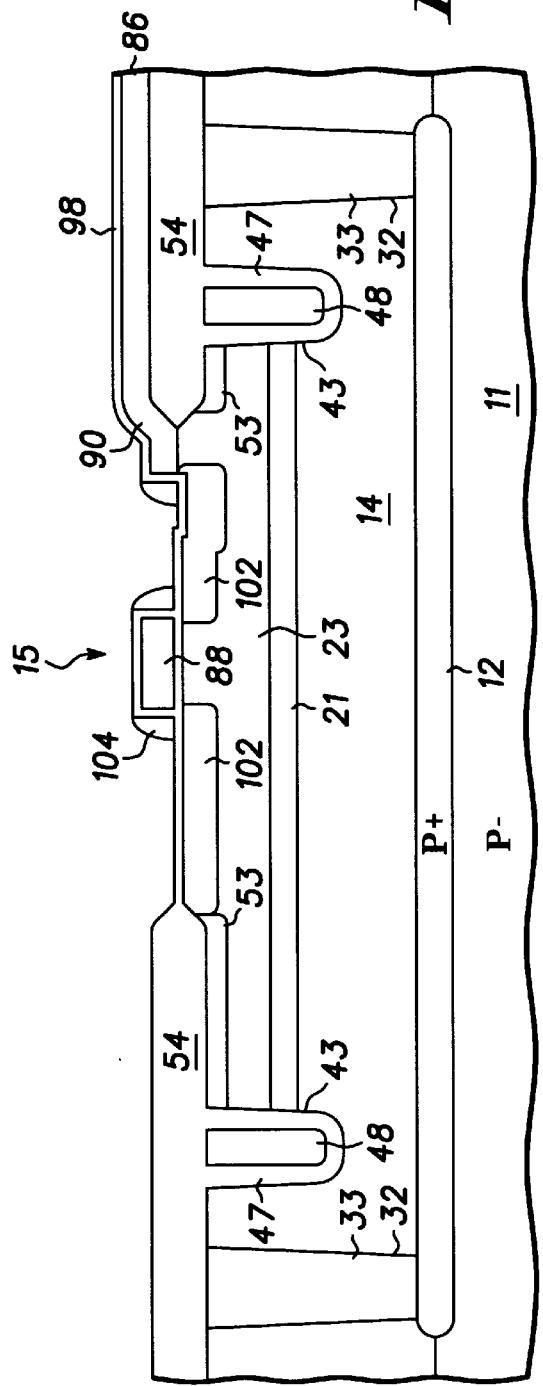
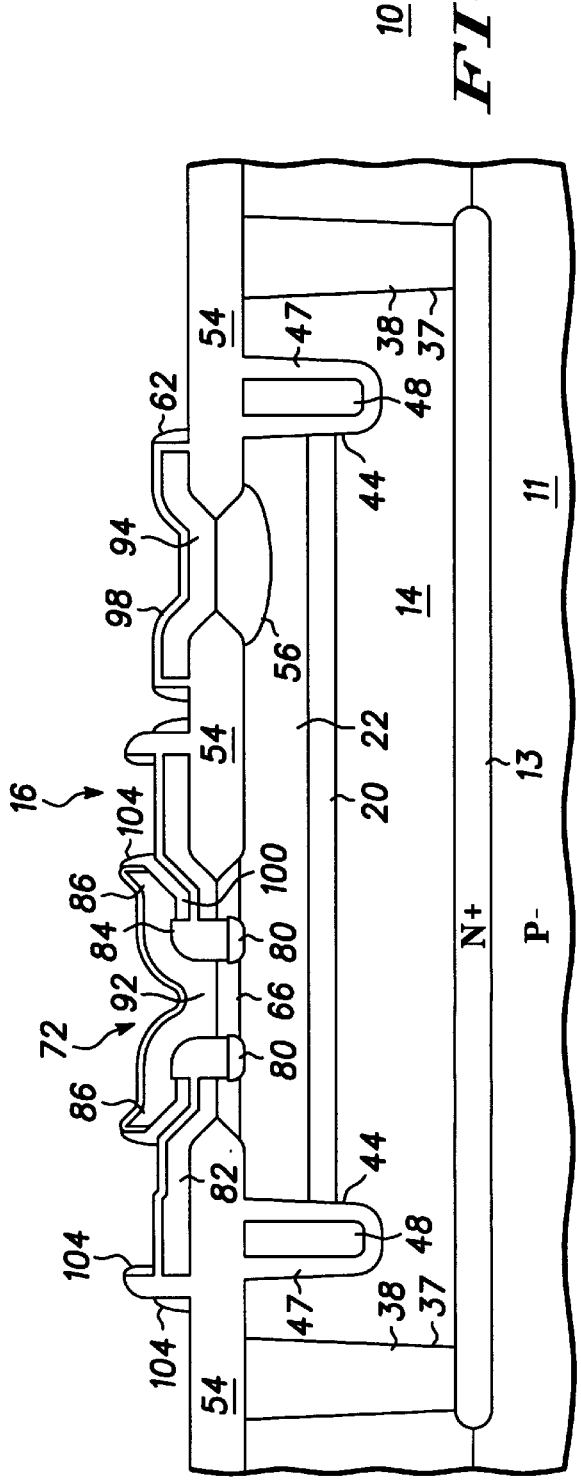
FIG. 17
FIG. 18

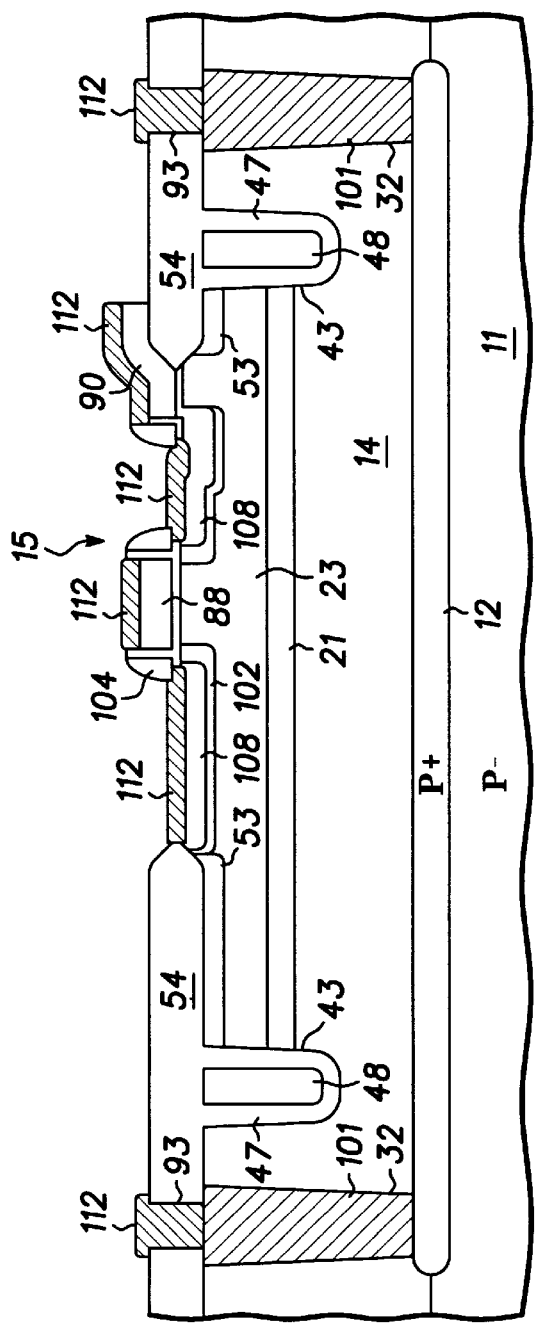
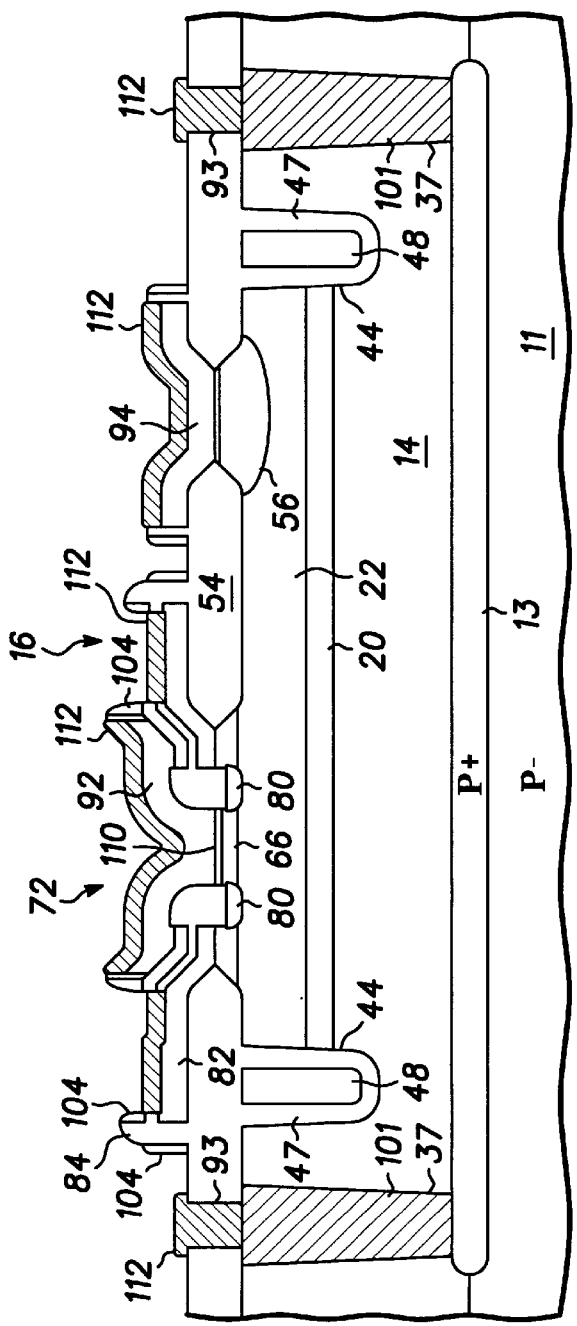

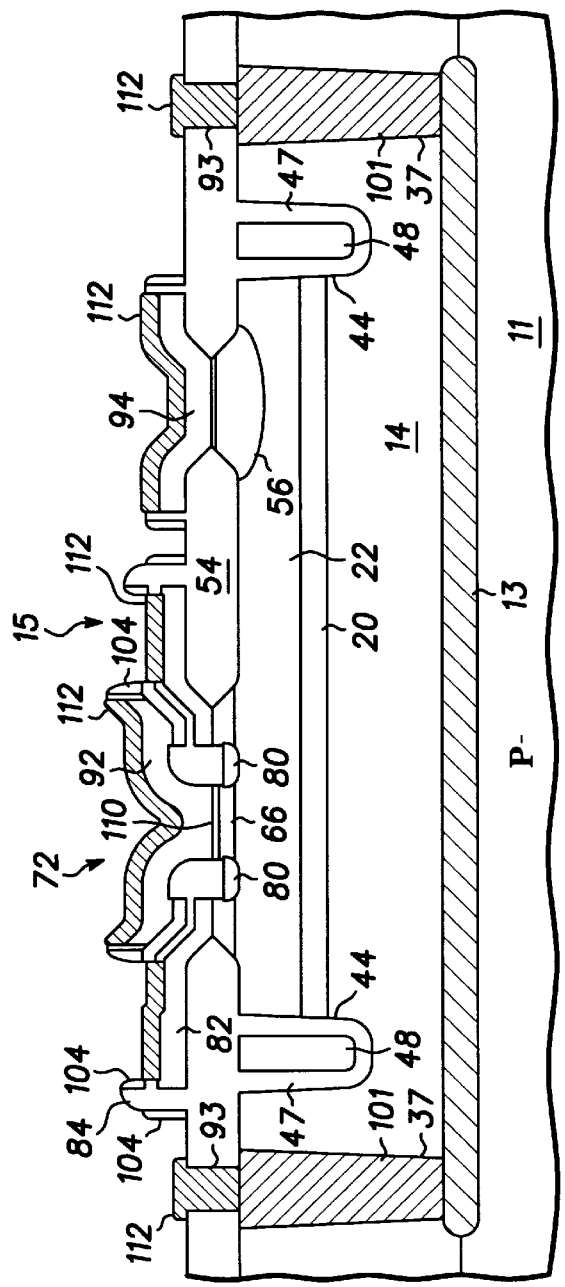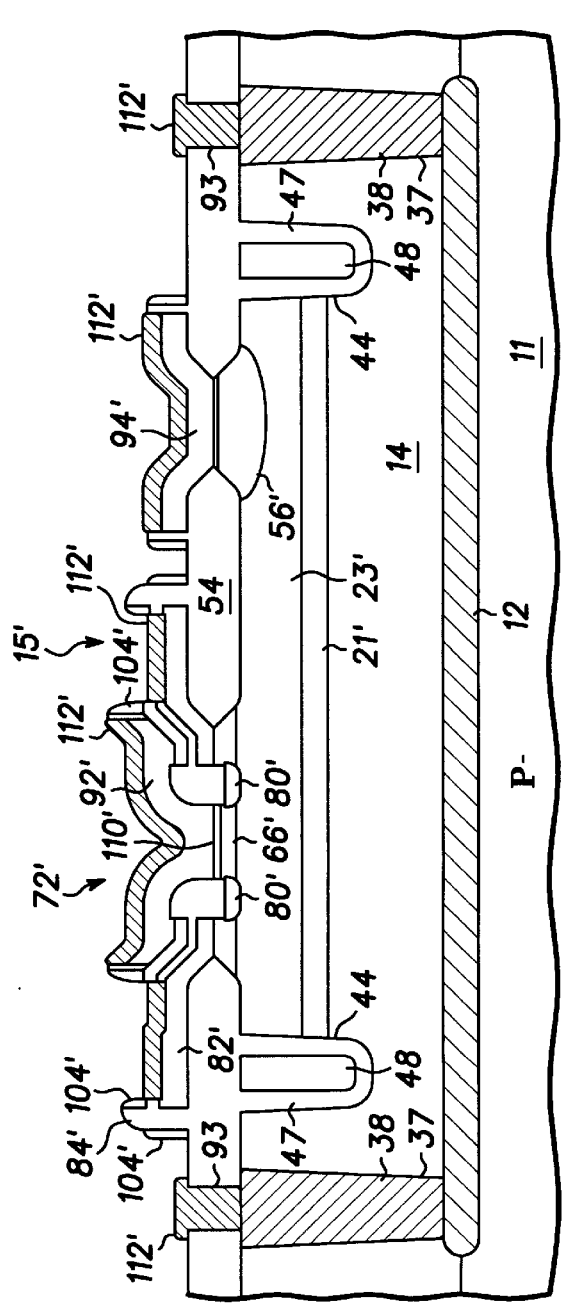

SEMICONDUCTOR STRUCTURE AND METHOD OF MANUFACTURE

BACKGROUND OF THE INVENTION

The present invention relates, in general, to semiconductor structures and, more particularly, to semiconductor structures having isolation regions.

Generally, semiconductor device manufacturers fabricate many semiconductor devices within a single semiconductor material. An important consideration in manufacturing semiconductor devices is providing electrical isolation between different devices which comprise an integrated circuit. Electrical isolation is particularly important when monolithically integrating bipolar junction transistors with insulated gate field effect transistors. A common technique for isolating semiconductor devices is by providing vertically oriented structures, such as dielectric filled trenches, between the various devices. A drawback of these types of structures is that noise generated by one device travels through the substrate and interferes with other devices. Another technique is to build the devices on a silicon-on-insulator (SOI) substrate and separate each device laterally by oxide filled trenches. This technique adds to the complexity of the processing and requires the use of SOI technology.

Accordingly, it would be advantageous to have a structure and method for electrically shielding semiconductor devices manufactured in the same semiconductor material from each other. It would be of further advantage for the method of manufacture to be cost efficient and integrable with available processing techniques.

BRIEF DESCRIPTION OF THE DRAWINGS

FIGS. 1–2 are highly enlarged transparent oblique isometric sections of an isolation portion of a semiconductor structure during processing in accordance with a first embodiment of the present invention;

FIGS. 3–20 are highly enlarged cross-sectional views of the semiconductor structure of FIGS. 1 and 2 having an insulated gate field effect transistor and a bipolar transistor formed therein;

FIGS. 21–22 are highly enlarged cross-sectional views of a semiconductor structure in accordance with a second embodiment of the present invention; and FIGS. 23–24 are highly enlarged cross-sectional views of a semiconductor structure in accordance with a third embodiment of the present invention.

DETAILED DESCRIPTION OF THE DRAWINGS

Figure 11:
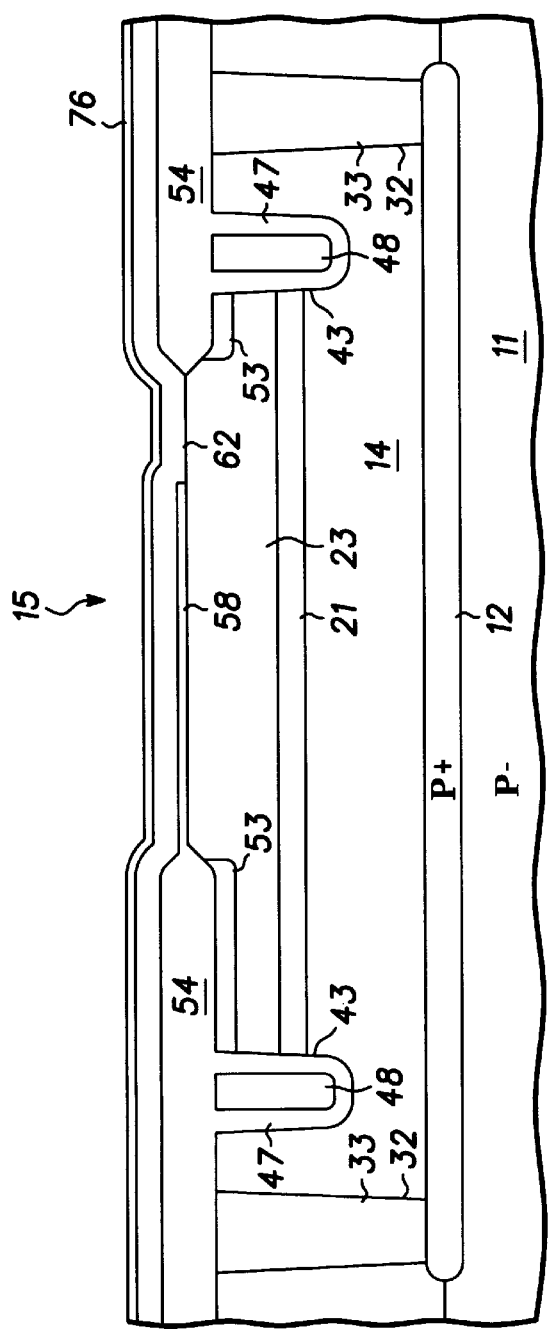

FIGS. 1–20 are highly enlarged transparent oblique isometric views of a semiconductor structure 10 having shielding structures in which electrical devices are manufactured. In accordance with one embodiment of the present invention, the shielding structures are comprised of localized buried layers in combination with highly doped sidewalls that are formed in a lightly doped semiconductor material, wherein the conductivity types of the buried layers, the highly doped sidewalls, and the semiconductor material are the same. The use of localized buried layers prevents cross-talk that occurs in semiconductor circuits that share a common buried layer. In addition, the lightly doped semiconductor material helps attenuate any noise that may be transmitted through the substrate.

In accordance with another embodiment, the buried layer is formed from a buried layer of the same conductivity type as the semiconductor material, but the sidewalls are formed from an electrically conductive material such as metal. In accordance with yet a third embodiment, the shielding structure is formed from metal. It should be understood that the electrical devices within the shielding structures may be bipolar transistors, Insulated Gate Field Effect Transistors (IGFET's), Junction Field Effect Transistors (JFET's), resistors, capacitors, etc.

Although specific materials, conductivity types, thicknesses, and other parameters are set forth herein, it should be understood that these are not meant to be limiting and only serve to show a preferred embodiment of the present invention. Further, it should be understood that the same reference numerals are used in the figures to denote the same elements.

FIG. 1 is a highly enlarged cross-sectional isometric view of a semiconductor structure 10 having portions 15 and 16 at an early stage of manufacture in accordance with a first embodiment of the present invention. In accordance with this embodiment, an IGFET is fabricated in portion 15, therefore, portion 15 is also referred to as an IGFET region. Similarly, a bipolar junction transistor is fabricated in a portion 16, therefore, portion 16 is referred to as a bipolar region. Initially, a semiconductor substrate 11 comprising single crystal silicon of a <100> crystallographic orientation is provided. By way of example, substrate 11 is of P conductivity type and has a conductivity less than approximately 2 Siemens per centimeter. A screen oxide layer (not shown) is formed on substrate 11. The screen oxide layer is thermally grown and has a thickness on the order of 200 angstroms. The screen oxide layer serves to protect the surface of substrate 11 from contamination. Substrate 11 is lightly doped to attenuate electrical communication between different device regions, e.g., regions 15 and 16.

Localized P+ buried layers 12 and 13 are formed in portions of substrate 11 by implanting boron or another P type dopant into substrate 11. After forming P+ buried layers 12 and 13, substrate 11 is annealed. Preferably, buried layers 12 and 13 have a conductivity of greater than approximately 50 Siemens per centimeter. Simultaneously with annealing P+ buried layers 12 and 13, additional oxide is grown on the screen oxide layer (not shown). The thickness of the screen oxide layer becomes on the order of 3,000 to 4,000 angstroms over P+ buried layers 12 and 13. It should be noted that the method of forming buried layers 12 and 13 is not a limitation of the present invention. In other words, buried layers 12 and 13 can be formed using diffusion techniques or by implantation into an epitaxial layer.

Following the formation of buried layers 12 and 13, the entire screen oxide layer (not shown) is removed to expose substrate 11 and buried layers 12 and 13. The screen oxide layer may be removed with a wet etchant such as hydrofluoric acid. Once the screen oxide is removed and substrate 11 exposed, a semiconductor material such as, for example, an epitaxial layer 14 having a major surface 17 is formed on substrate 11. Epitaxial layer 14 may be formed from intrinsic silicon, or may be a lightly doped P–epitaxial layer. By way of example, epitaxial layer 14 is doped with a P-type impurity material having a similar concentration as substrate 11. The thickness of epitaxial layer 14 is on the order of 1.6 micrometers ($\mu$m). Similar to the lightly doped substrate, using a lightly doped epitaxial layer helps reduce cross-talk between regions 15 and 16. It should be noted that the use of intrinsic silicon for epitaxial layer 14 provides greater device isolation in the finished product.

A well oxide layer 18 is formed on epitaxial layer 14. Well oxide layer 18 has a thickness on the order of 500 angstroms and may be thermally grown or deposited. A well nitride layer 19 is then deposited on well oxide layer 18. Well nitride layer 19 has a thickness on the order of 1,400 angstroms.

Still referring to FIG. 1, the portion of well nitride layer 19 disposed over N+ buried layer 13 in portion 16 is removed, preferably by reactive ion etching (RIE). At this point well nitride layer 19 remains disposed over P+ buried layer 12. Arsenic or another N type dopant is implanted into the portion of epitaxial layer 14 above P+ buried layer 13 to form an N+ buried layer 20. After formation of buried layer 20, phosphorus or another N type dopant is implanted into the portion of epitaxial layer 14 above N+ buried layer 20 to form an N well 22. N+ buried layer 20 and N well 22 are annealed. Simultaneously with annealing N+ buried layer 20 and N well 22, the portions of well oxide layer 18 disposed over N well 22 are further thermally oxidized to a thickness on the order of approximately 3,000 to 4,000 angstroms.

Following the oxidation and anneal steps, the portions of well nitride layer 19 disposed over P+ buried layer 12 is removed. An etch that will selectively remove well nitride layer 19 without significantly etching well oxide layer 18 disposed therebetween is employed. Once these portions of well nitride layer 19 have been removed, boron or another P type dopant is implanted into epitaxial layer 14 above P+ buried layer 12 to form a P+ buried layer 21. P+ buried layer 21 and P well 23 are annealed. The increased thickness of well oxide layer 18 over N well 22 is sufficient to prohibit the P type dopant from significantly entering N well 22. After implanting the P type dopant, substrate 11 is annealed. Following the annealing step, well oxide layer 18 is completely removed from surface 17 of the portions of epitaxial layer 14 in which N well 22 and P well 23 have been formed.

Now referring to FIG. 2 and after removal of well oxide layer 18, a pad oxide layer 24 is formed on surface 17 of epitaxial layer 14. Pad oxide layer 24 has a thickness on the order of 150 angstroms and may be formed by thermally oxidizing epitaxial layer 14. A polysilicon layer 28 is formed on pad oxide layer 24 and has a thickness on the order of about 500 angstroms. A nitride layer 29 is deposited on polysilicon layer 28. By way of example, nitride layer 29 has a thickness on the order of about 1,500 angstroms. An oxide layer (not shown) is formed on nitride layer 29. The oxide layer has a thickness on the order of about 2,600 angstroms and may be formed by well known processes such as deposition by the decomposition of tetraethyl orthosilicate (TEOS).

Shielding trenches 32 and 37 are formed in regions 15 and 16, respectively, to extend from major surface 17 to respective P+ buried layers 12 and 13. Preferably, shielding trenches 32 are formed in an annular shape by patterning a photoresist layer (not shown) to have openings above the regions where shielding trenches 32 and 37 are to be formed. The oxide layer and nitride layer 29 below the openings in the photoresist are removed using, for example, an RIE etch. Subsequently, an RIE etch is performed through polysilicon layer 28, pad oxide layer 24, epitaxial layer 14, and into P+ buried layers 12 and 13 to form trenches 32 and 37, respectively.

The photoresist and the oxide layer are removed and the surfaces of trenches 32 and 37 are cleaned. P+ doped polysilicon trench fill material 33 and 38 is formed in the respective trenches 32 and 37. Although not shown, it shall be understood that the trench fill polysilicon is also formed conformally on the surface of nitride layer 29. Therefore, trench fill polysilicon 33 and 38 not disposed in trenches 32 and 37, respectively, is removed from the surface of nitride layer 29 and an oxide layer 42 is formed on nitride layer 29 and polysilicon filled trenches 32 and 37. Oxide layer 42 has a thickness on the order of about 2,600 angstroms and may be formed by well known processes.

Trench fill polysilicon 33 cooperates with trenches 32 and buried layer 12 to form a localized signal isolation or shielding structure 39 and trench fill polysilicon 38 cooperates with trenches 37 and buried layer 13 to form a localized signal isolation or shielding structure 40.

Once shielding structures such as, for example, shielding structures 39 and 40 have been formed, semiconductor transistors can be formed within the semiconductor regions isolated by these structures. FIGS. 3–20 have been included to illustrate such a process. To more easily illustrate the fabrication of a transistor within each region, FIGS. 3–20 have been drawn such that FIGS. 3, 5, 7, 9, 11, 13, 15, 17, and 19 represent the portion of semiconductor 10 to the left of reference plane 2 and FIGS. 4, 6, 8, 10, 11, 12, 14, 16, 18, and 20 illustrate the portion of semiconductor structure 10 to the right of reference plane 2. In other words, to more clearly illustrate the fabrication of transistors within regions 15 and 16 of semiconductor structure 10, it has been divided at reference plane 2 such that the fabrication of a bipolar transistor is shown in FIGS. 3, 5, 7, 9, 11, 13, 15, 17, and 19 and the fabrication of an insulated gate field effect transistor is shown in FIGS. 4, 6, 8, 10, 11, 12, 14, 16, 18, and 20. Thus, FIGS. 3 and 4 represent semiconductor processing that occurs simultaneously, FIGS. 5 and 6 represent semiconductor processing that occurs simultaneously, FIGS. 7 and 8 represent semiconductor processing that occurs simultaneously, etc.

Now referring to FIGS. 3 and 4, isolation trenches 43 and 44 are formed in regions 15 and 16, respectively, to extend from major surface 17 into epitaxial layer 14. More particularly, trenches 43 and 44 extend completely through N well 22 and P well 23, respectively, into epitaxial layer 14. However, it should be understood that isolation trenches 43 and 44 do not extend completely through epitaxial layer 14 to P+ buried layers 12 and 13, respectively. Preferably, isolation trenches 43 and 44 are formed by patterning a photoresist layer (not shown) to have openings above the regions where trenches 43 and 44 are to be formed. Oxide layer 42 and nitride layer 29 below the openings in the photoresist are etched using, for example, an RIE etch. Subsequently, an RIE etch is performed through polysilicon layer 28, pad oxide layer 24, and into epitaxial layer 14 to form trenches 43 and 44. The photoresist and oxide layer 42 are removed and the surfaces of trenches 43 and 44 are cleaned.

Now referring to FIGS. 5 and 6, a trench liner oxide 47 is formed in trenches 43 and 44. Although trench liner oxide 47 is only shown in trenches 43 and 44, it should be understood that trench liner oxide 47 is originally formed as a conformal layer. Initially, trench liner oxide 47 has a thickness on the order of 2,600 angstroms.

A trench fill polysilicon 48 is formed in trenches 43 and 44. Although not shown, it shall be understood that trench fill polysilicon 48 is also formed conformally on the surface of nitride layer 29. A spin-on glass (not shown) is applied over the surface of nitride layer 29. The spin-on glass serves to planarize the surfaces. The spin-on glass and the portions of trench fill polysilicon 48 not disposed in trenches 43 and 44 are etched back by RIE until conformal trench liner oxide 47 is exposed. Trench fill polysilicon 48 is recessed from the top of trenches 43 and 44. Once trench fill polysilicon 48 has been etched back, the portions of trench liner oxide 47 not disposed in trenches 43 and 44 are removed, preferably by RIE. Trenches 43 and 44 serve as device isolation structures.

Still referring to FIGS. 5 and 6, trench liner oxide 47 is removed to expose the surface of nitride layer 29.

Now referring to FIGS. 7 and 8, portions of nitride layer 29 are removed so that only nitride portions 51 remain. Nitride spacers 52 are formed on the ends of nitride portions 51 by depositing a conformal nitride layer (not shown) over the surfaces of regions 15 and 16. The conformal nitride layer (not shown) is anisotropically etched using RIE to form nitride spacers 52.

Following the formation of nitride spacers 52, field regions 53 are formed by implanting a P type dopant into P well 23 to control inversion beneath field oxide regions 54. The implant into field regions 53 is self aligned to nitride portions 51 and to nitride spacers 52 disposed above P well 23. More particularly, field regions 53 are formed by implanting boron or another P type dopant into P well 23. Field regions 53 have a dopant concentration on the order of $10^{17}$ atoms/cm$^3$. The exposed portions of polysilicon layer 28 (those beneath nitride portions 52) and the trench fill polysilicon 48 are oxidized to form field oxide regions 54. Field oxide regions 54 have a thickness on the order of 6,000 to 7,000 angstroms. It should be understood that field regions 53 are annealed during the formation of field oxide regions 54.

Following the formation of field oxide regions 54, nitride portions 51 and nitride spacers 52 are removed.

Now referring to FIGS. 9 and 10, a collector region 56 is formed in bipolar region 16. Collector region 56 is formed by implanting a dopant into N well 22 of bipolar region 16. Collector region 56 is of an N+ conductivity type and has a dopant concentration in the range of $10^{18}$ to $10^{19}$ atoms/cm$^3$. Those skilled in the art are aware that defect problems caused by the implant should be minimized. Collector regions 56 may extend through N well 22 to N+ buried layer 20.

A gate oxide layer 58 is formed over the entire surface of semiconductor structure 10. By way of example, gate oxide layer 58 has a thickness on the order of 100 angstroms and is thermally grown, although it could be deposited by methods well known to those skilled in the art. A gate polysilicon layer 60 (shown as a portion of polysilicon layer 62) is formed on gate oxide layer 58. Polysilicon layer 60 has a thickness of approximately 500 angstroms and serves to protect gate oxide layer 58 during future processing.

Threshold and punch-through implants are performed into P well 23 of IGFET region 15. An N-type dopant such as phosphorus is implanted into P well 23. Either single or multiple implants into P well 23 may be performed. These implants serve to control the threshold voltage of the device and prevent punch-through.

Following the threshold and punch-through implants, gate oxide layer 58 and polysilicon layer 60 are selectively removed from IGFET region 15. More particularly, the portions of gate oxide layer 58 are removed from where well 23 are to be contacted by first electrode polysilicon layer 62. Gate oxide layer 58 and polysilicon layer 60 are completely removed from above N well 22 in bipolar region 16.

A first polysilicon layer 62 is formed conformally over the entire semiconductor structure 10. First electrode polysilicon layer 62 is formed by methods well known in the art and has a thickness on the order of 2,000 angstroms. First polysilicon layer 62 is undoped at deposition. Following the deposition of first electrode polysilicon layer 62, a screen oxide layer 64 is formed over the entire surface of semiconductor structure 10. Screen oxide layer 64 is thermally grown and has a thickness on the order of 100 angstroms.

An active base 66 is formed in N well 22 of bipolar region 16. A P type dopant such as boron or boron difluoride is implanted into a portion of first electrode polysilicon layer 62. Semiconductor structure 10 is then annealed so that the dopant is driven from the portion of first electrode polysilicon layer 62 into N well 22 of bipolar region 16 to form active base 66. Active base 66 is P type and has a peak dopant concentration on the order of $10^{19}$ atoms/cm$^3$. Following the formation of active base 66, a nitride layer 68, and a polysilicon layer 70 are formed over the surface of semiconductor structure 10.

Figure 12:
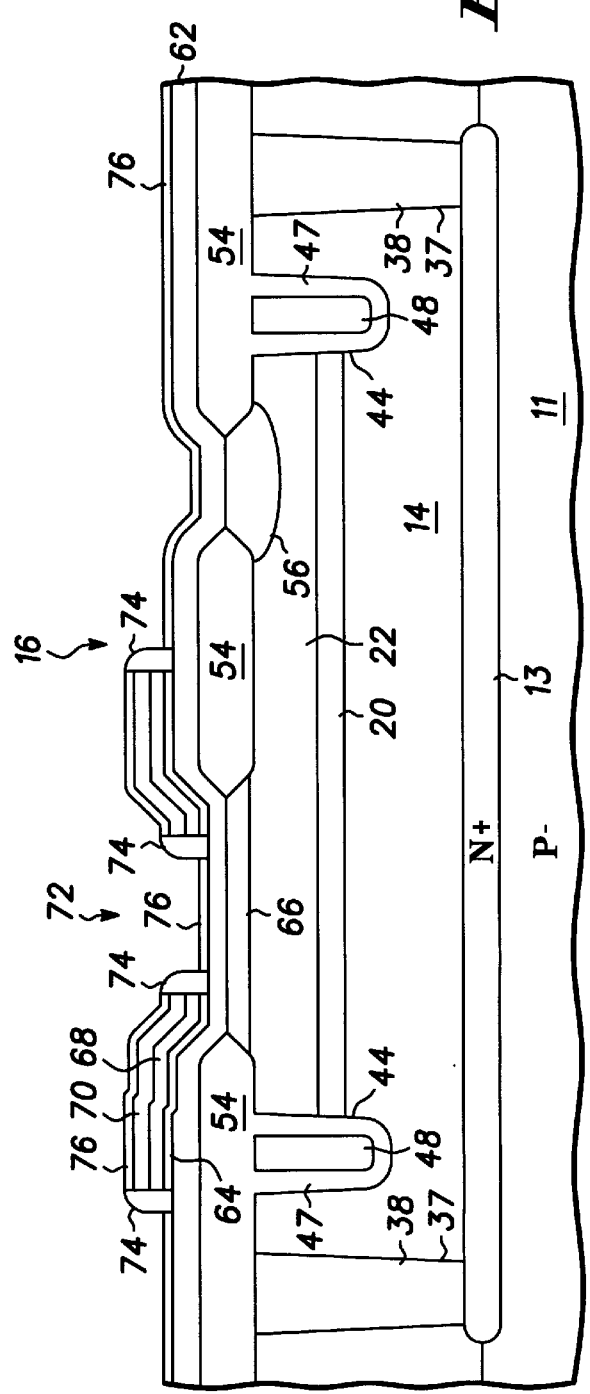

Now referring to FIGS. 11 and 12, screen oxide layer 64, nitride layer 68, and polysilicon layer 70 are patterned and etched so that they are disposed only above N well 22 of bipolar region 16 away from collector region 56. An opening 72 is formed through the remaining portions of screen oxide layer 64, nitride layer 68, and polysilicon layer 70 will serve to later define the base electrode of the bipolar device.

Nitride spacers 74 are formed at the ends of the remaining portions of screen oxide layer 64, nitride layer 68, polysilicon layer 70, and in opening 72. Nitride spacers 74 are formed by depositing a conformal nitride layer (not shown) over semiconductor structure 10 and then reactive ion etching the conformal nitride layer to form spacers 74. The distance between spacers 74 in opening 72 may be less than is readily obtainable using well known lithographic methods. Preferably, this distance is on the order of 0.4 μm. A lens oxide layer 76 is formed on all exposed polysilicon of IGFET region 15 and bipolar region 16 of semiconductor structure 10. This includes formation on the exposed portions of first electrode polysilicon layer 62 and also on the exposed portions of polysilicon layer 70. A portion of lens oxide layer 76 is disposed in opening 72 between spacers 74. Lens oxide layer 76 is thermally grown and is on the order of 600 angstroms thick.

Now referring to FIGS. 13 and 14, nitride spacers 74 are removed leaving the portions of first electrode polysilicon layer 62 disposed therebeneath exposed. These exposed portions of first electrode polysilicon layer 62 are then etched away to form slots 78 where nitride spacers 74 were formerly disposed. Slots 78 not disposed inside opening 72 extend to field oxide regions 54 while slots 78 disposed within window 72 may extend into the silicon of active base region 66. Following the formation of slots 78, a screen oxide layer (not shown) is formed on the surface of IGFET region 15 and bipolar region 16.

Link base regions 80 are formed beneath slots 78 in window 72 following the formation of the screen oxide layer. Link base regions 80 are formed by implanting a P type dopant such as boron or boron difluoride through slots 78 disposed in opening 72. Link base regions 80 serve to link active base region 66 to extrinsic base contacts 82. Link base regions 80 have a dopant concentration on the order of $10^{18}$ atoms/cm$^3$.

Following the formation of link base regions 80, oxide spacers 84 are formed in slots 78. Oxide spacers 84 are fabricated by forming an oxide layer (not shown) on the screen oxide layer, and etching the entire oxide layer, the screen oxide layer, and lens oxide layer 76. Oxide spacers 84 are not etched. It should be understood that a densification anneal to densify the oxide layer may be performed prior to etching oxide spacers 84 from the oxide layer, the screen oxide layer, and lens oxide layer 76.

Figure 15:
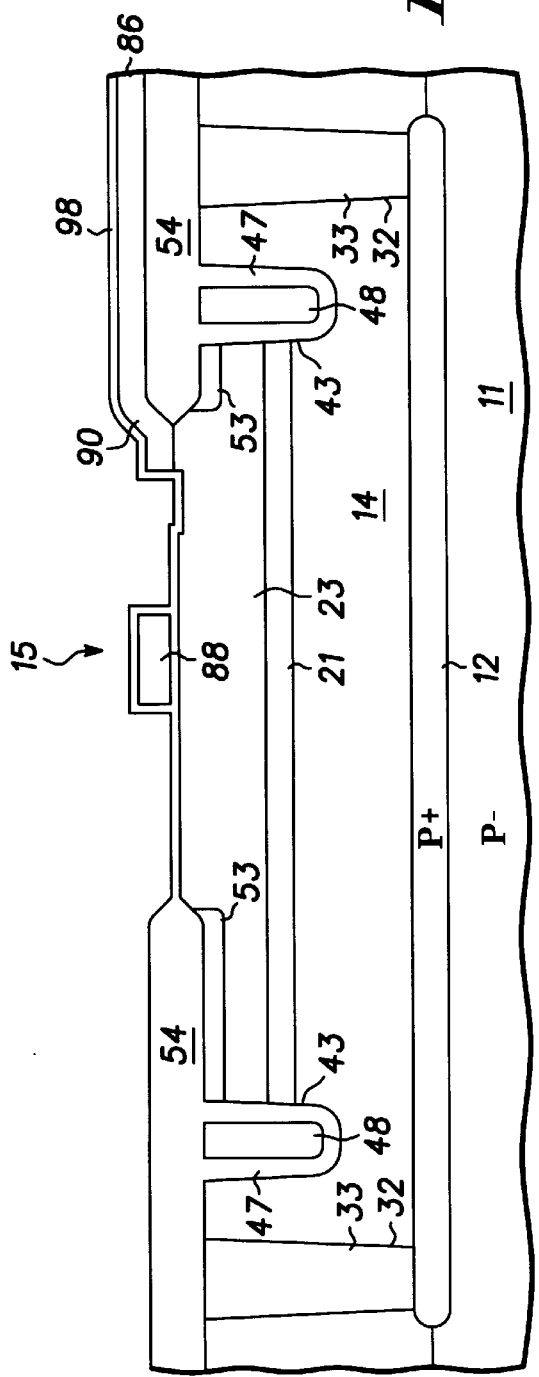
Figure 16:
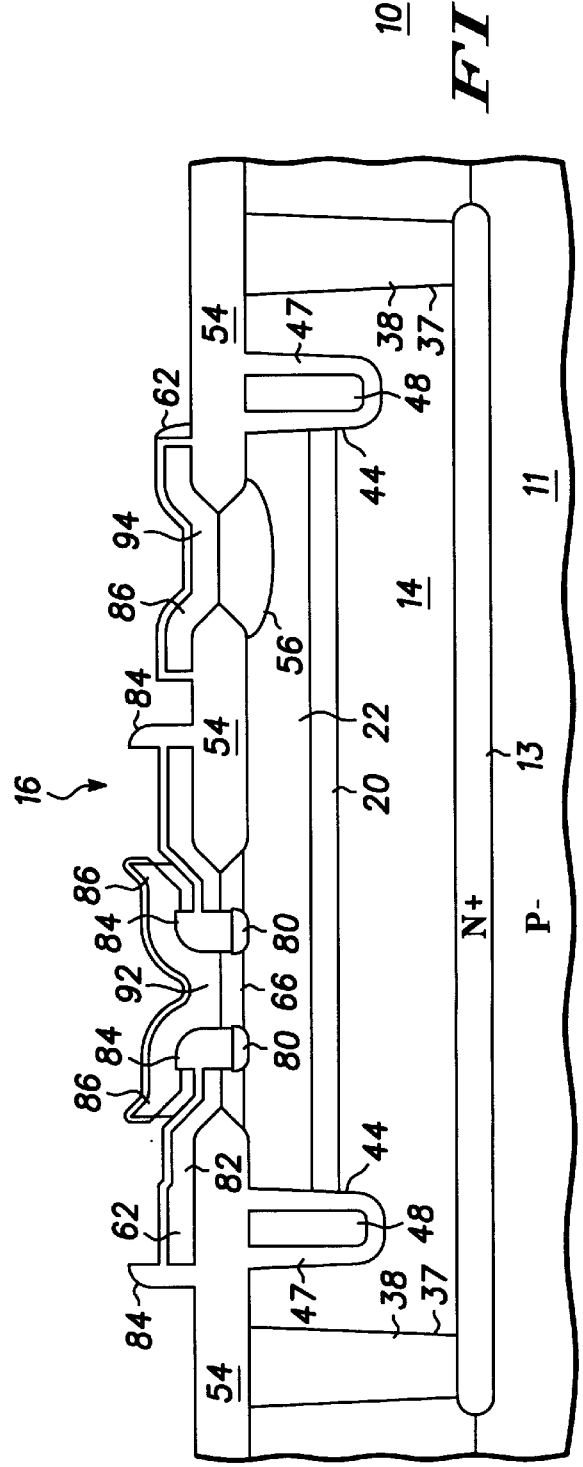

Now referring to FIGS. 15 and 16, a second electrode polysilicon layer 86 is formed directly on first electrode polysilicon layer 62 except where the portions of screen oxide layer 64, nitride layer 68 and polysilicon layer 70 remain at the time of the deposition of second electrode polysilicon layer 86. Second electrode polysilicon layer 86 is preferably undoped when deposited and has a thickness on the order of 1,200 angstroms.

Following the deposition of second electrode polysilicon layer 86, second electrode polysilicon layer 86 and first electrode polysilicon layer 62 are patterned and etched. Gate electrodes 88 and a buried contact electrode 90 are formed in IGFET region 15. An emitter electrode 92 and a collector electrode 94 are formed on bipolar region 16. Gate electrodes 88, buried contact electrode 90, cathode electrodes 91, emitter electrode 92, and collector electrode 94 are each comprised of portions of first electrode polysilicon layer 62 and second electrode polysilicon layer 86. Additionally, the etching of first and second electrode polysilicon layers 62 and 86, respectively, simultaneously removes the remaining portions of polysilicon layer 70 and exposes the remaining portions of nitride layer 68.

Following the patterning and etching of first and second electrode polysilicon layers 62 and 86, respectively, a protective oxide layer 98 is formed on he exposed silicon portions of IGFET region 15 and bipolar region 16. Although protective oxide layer 98 is thermally grown herein, it should be understood that it may be deposited. Protective oxide layer 98 has a thickness on the order of 100 angstroms.

Cathode electrodes 91, emitter electrode 92, and collector electrode 94 are doped. Doping of electrodes 91, 92, and 94 may occur either before or after the formation of protective oxide layer 98. Arsenic or a similar N type dopant is implanted into electrodes 91, 92, and 94 to obtain a dopant concentration on the order of $10^{20}$ atoms/cm$^3$. Following the implantation of electrodes 91, 92, and 94, the remaining exposed portions of nitride layer 68 are removed leaving only nitride portions 100 disposed beneath the lateral extensions of emitter electrode 92 and abutting oxide spacers 84.

Now referring to FIGS. 17 and 18, lightly doped drain regions 102 are formed by implanting a dopant into P well 23 of IGFET region 15. Lightly doped drain regions 102 are formed in P well 23 by implanting an N type dopant such as phosphorus. The implants are self aligned to the gate electrodes 88. Lightly doped regions 102 have a surface dopant concentration on the order of $10^{18}$ atoms/cm$^3$.

Simultaneously with the formation of lightly doped regions 102, gate electrodes 88 and buried contact electrode 90 are also doped. Gate electrode 88 and the portion of buried contact electrode 90 disposed over P well 23 are doped with an N type dopant.

Nitride spacers 104 are formed in IGFET region 15 and bipolar region 16. In IGFET region 15, nitride spacers 104 abut the sides of each gate electrode 88 and also the sides of buried contact electrode 90. In bipolar region 16, nitride spacers 104 abut the sides of collector electrode 94 and those oxide spacers 84 not disposed in opening 72. Nitride spacers 104 also abut the sides of emitter electrode 92. Nitride spacers 104 which abut emitter electrode 92 are coupled to nitride portions 100. Nitride spacers 104 are formed by forming a conformal nitride layer (not shown) over the surface of IGFET region 15 and bipolar region 16. Then, the unwanted portions of the conformal nitride layer are etched away to form nitride spacers 104. Although spacers 104 comprise nitride herein, it should be understood that other dielectric materials may be substituted.

Figure 19:
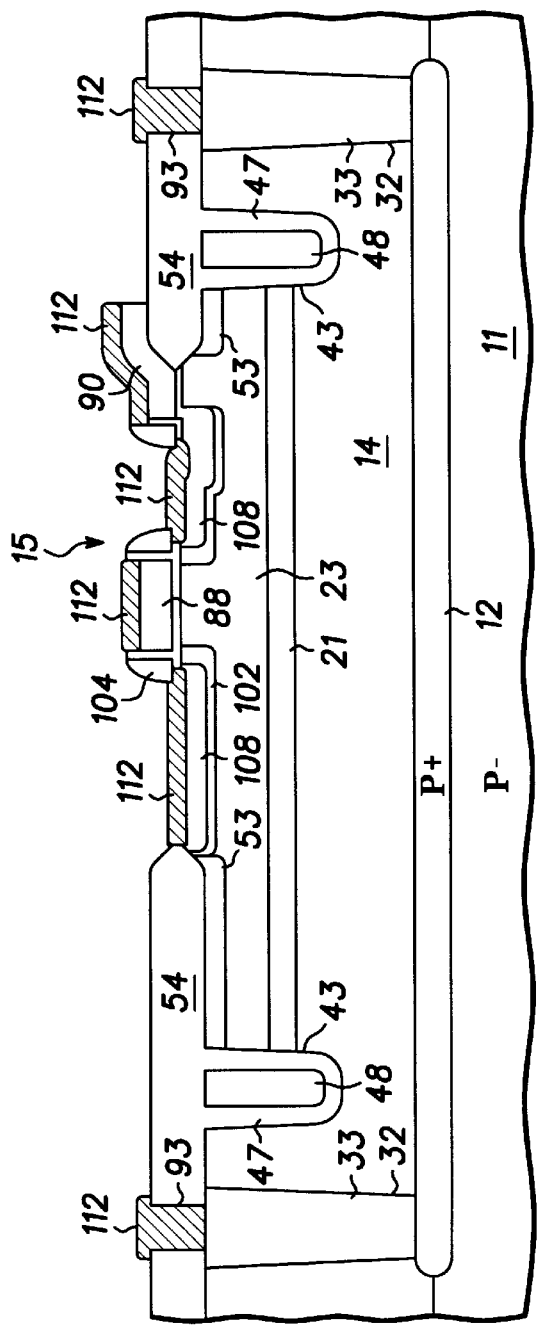
Figure 20:
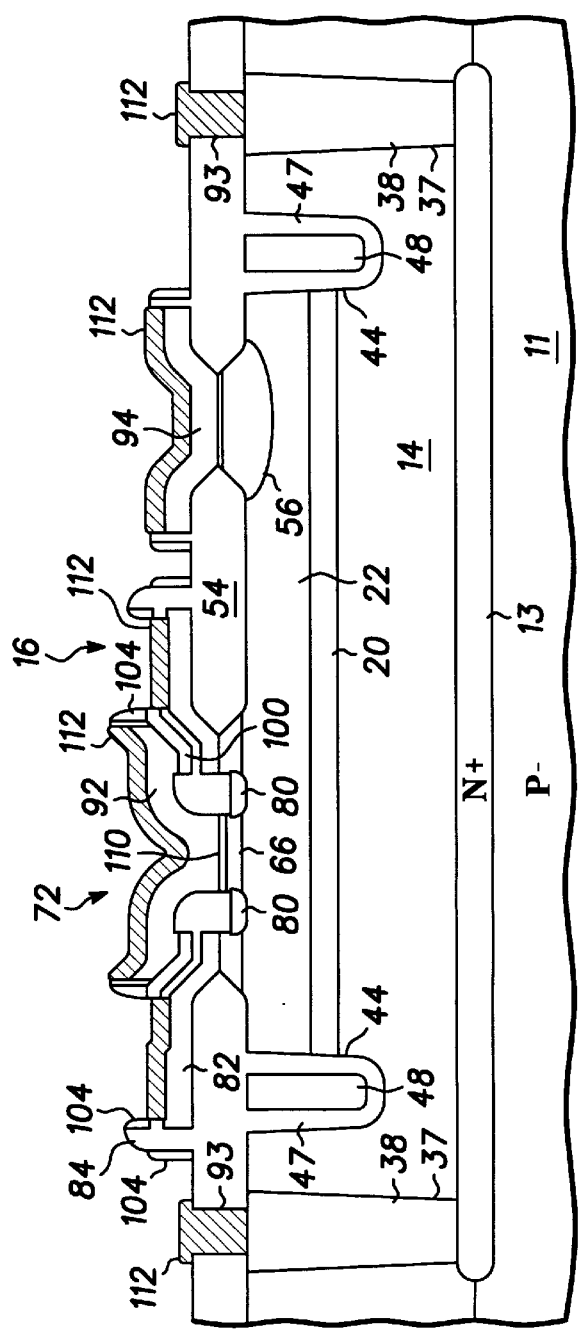

FIGS. 19 and 20 are highly enlarged cross-sectional views of semiconductor structure 10 in accordance with the present invention. Source and drain regions 108 are implanted into P well 23 of IGFET region 15. Source and drain regions 108 are formed in P well 23 by implanting an N type dopant such as arsenic. Preferably, source and drain regions 108 have a surface dopant concentration of at least $10^{20}$ atoms/cm$^3$. Gate electrode 88 and buried contact electrode 90 are further doped during the formation of source and drain regions 108.

Following the formation of source and drain regions 108, semiconductor structure 10 is annealed. Preferably a rapid thermal anneal is employed. During the anneal, source and drain regions 108 are properly diffused. Further, emitter region 110 is diffused from emitter electrode 92 between link base regions 80. Also during this anneal step, additional dopant is diffused from extrinsic base electrode 82 into active base 66. Following the anneal step, protective oxide layer 98 is removed from the surface of IGFET region 15 and bipolar region 16 of the semiconductor structure 10.

Openings 93 are formed in field oxide layer 54 to expose portions of trench fill polysilicon 33 and 38. Likewise, portions of oxide layer 98 are removed to expose the electrodes of semiconductor structure 10. Then, a silicide 112 is formed on the exposed portions of trench fill polysilicon 33 and 38, as well as on the exposed electrodes of semiconductor structure 10. Although virtually any silicide may be formed, titanium disilicide is employed herein. Titanium disilicide 112 is formed by depositing a titanium layer on IGFET region 15 and bipolar region 16. Semiconductor structure 10 is then annealed so that the deposited titanium reacts with the exposed silicon to form titanium disilicide. Following the anneal step, non-silicided portions of the deposited titanium are etched away and semiconductor structure 10 is annealed for a second time. As shown, titanium disilicide 112 is formed on gate electrode 88, buried contact electrode 90, and source and drain regions 108 of IGFET region 15. Titanium disilicide 112 is also formed on extrinsic base electrode 82, emitter electrode 92, and collector electrode 94 of bipolar region 16.

Following the formation of silicide 112, an interlayer dielectric such as oxide may be formed on the surface of semiconductor structure 10 and a multilayer metallization pattern may be formed thereon.

The method of fabricating a semiconductor structure having IGFET and bipolar devices shown herein employs split polysilicon electrodes wherein gate electrodes 88, buried electrode 90, emitter electrode 92, and collector electrode 94 are formed from at least two separately deposited layers of polysilicon.

The bipolar transistor formed in bipolar region 16 may serve as a noise generating device and the IGFET formed in IGFET region 15 may serve as a noise sensitive device. Shielding structures 39 and 40 may be coupled for receiving a source of operating potential such as a ground potential. When the noise generating device generates noise, the noise signal is removed via the shielding structure and therefore does not interfere with the noise sensitive device. It should be understood that although both the bipolar transistor and the IGFET are shown as being within shielding structures 39 and 40, this is not a limitation of the present invention. For example, placing one of the devices within the confines of the shielding structure may provide sufficient noise immunity.

FIGS. 21 and 22 illustrate a semiconductor structure 100 in accordance with a second embodiment of the present invention. Semiconductor structure 100 is similar to semiconductor structure 10 except that trenches 32 and 37 are filled with metal 101. Techniques for filling trenches 32 and 37 with metal 101 rather than polysilicon are known to those skilled in the art.

FIGS. 23 and 24 illustrate a semiconductor structure 110 in accordance with a third embodiment of the present invention. Semiconductor structure 110 is similar to semiconductor structures 10 and 100 except that buried layers 113 and 114 and well 115 are comprised of metal. Further, semiconductor structure 10 illustrates two bipolar transistors. It should be noted that a prime (') has been added to the reference numbers to distinguish the first and second transistors from each other.

By now it should be appreciated that a semiconductor structure having a shield and a method for manufacturing the semiconductor structure have been provided. An advantage of the semiconductor structure of the present invention is that the localized shielding structures can be placed at a fixed potential such as, for example, ground to prevent crosstalk between neighboring devices. The present invention allows for the formation of mixed mode devices in a cost efficient manner. In addition, the present invention allows for the formation of shielded bipolar transistors, insulated gate field effect transistors, junction field effect transistors, varactors, passive components, etc. in a semiconductor material.

While the invention has been described in specific embodiments thereof, it is evident that many alterations, modifications, and variations will be apparent to those skilled in the art. Further, it is intended to embrace all such alterations, modifications, and variations in the appended claims. For example, the semiconductor structure can be manufactured in a non-epitaxially grown semiconductor material. Further, the semiconductor structure can be manufactured, wherein the buried layers forming the trenches are all of N type conductivity. In addition, it should be understood the number and types of semiconductor devices manufactured within the shielding structure is not a limitation of the present invention.

What is claimed is:

1. A semiconductor structure, comprising:

a semiconductor material having a major surface, wherein the semiconductor material is of a first conductivity type and a first concentration;

a localized signal isolation structure in the semiconductor material, the localized signal isolation structure separating a first portion of the semiconductor material from a second portion of the semiconductor material, wherein a portion of the localized signal isolation structure is metal; and a semiconductor device in the first portion of the semiconductor material.

2. The semiconductor structure of claim 1, wherein semiconductor material is silicon of the first conductivity type and the localized signal isolation structure comprises:

a metal buried layer in the semiconductor material; and an electrically conductive structure extending from the major surface to the metal buried layer.

3. The semiconductor structure of claim 2, wherein the electrically conductive structure is a semiconductor material of the first conductivity type and a second concentration, the second concentration higher than the first concentration.

4. The semiconductor structure of claim 2, wherein the electrically conductive structure is metal.

* * * * *